United States Patent
Hotchkiss

Patent Number: 6,107,606
Date of Patent: Aug. 22, 2000

[54] METHOD AND APPARATUS FOR MEASURING TEMPERATURES DURING ELECTRONIC PACKAGE ASSEMBLY

[75] Inventor: Gregory B. Hotchkiss, Richardson, Tex.

[73] Assignee: Texas Instruments Incorporated, Dallas, Tex.

[21] Appl. No.: 09/198,235

[22] Filed: Nov. 23, 1998

Related U.S. Application Data

[60] Provisional application No. 60/070,433, Jan. 5, 1998.

[51] Int. Cl.[7] .................................................. H01L 21/205
[52] U.S. Cl. ......................... 219/411; 392/416; 374/121; 438/5; 438/26; 438/123
[58] Field of Search ...................... 165/104.33; 374/130, 374/120, 121, 131; 392/411, 416, 494, 418; 219/411, 209, 210; 118/725, 50.1; 438/15, 16, 123; 324/126, 105; 228/180.22, 180.1

[56] References Cited

U.S. PATENT DOCUMENTS

| | | | |
|---|---|---|---|
| 4,278,867 | 7/1981 | Tan | 219/85.12 |
| 5,092,680 | 3/1992 | Kobayashi et al. | 374/121 |
| 5,116,137 | 5/1992 | Xiong et al. | 374/132 |
| 5,196,353 | 3/1993 | Sandhu et al. | 438/5 |
| 5,436,202 | 7/1995 | Miura | 228/102 |
| 5,577,157 | 11/1996 | Sopori | 392/416 |
| 5,713,666 | 2/1998 | Seelin et al. | 374/126 |
| 5,741,070 | 4/1998 | Moslehi | 374/161 |
| 5,984,522 | 11/1999 | Koizumi | 374/5 |
| 5,985,678 | 11/1999 | Kiyama | 438/5 |

FOREIGN PATENT DOCUMENTS

| | | |
|---|---|---|
| 55-105336 | 8/1980 | Japan . |
| 57-68041 | 4/1982 | Japan . |
| 1-255237 | 10/1989 | Japan . |
| 4-133442 | 5/1992 | Japan . |
| 8-255809 | 10/1996 | Japan . |

Primary Examiner—John A. Jeffery
Attorney, Agent, or Firm—Gary C. Honeycutt

[57] ABSTRACT

A novel technique for measuring the temperature of an electronic circuit undergoing assembly packaging processes includes a non-contact infrared detector which is used to measure the temperature of the die allowing a control systems to directly adjust the die temperature. Previous to this invention, the die temperatures were controlled indirectly, typically by controlling ambient temperature in an oven or furnace to a series of set point values during curing of the electronic packaging materials.

1 Claim, 3 Drawing Sheets

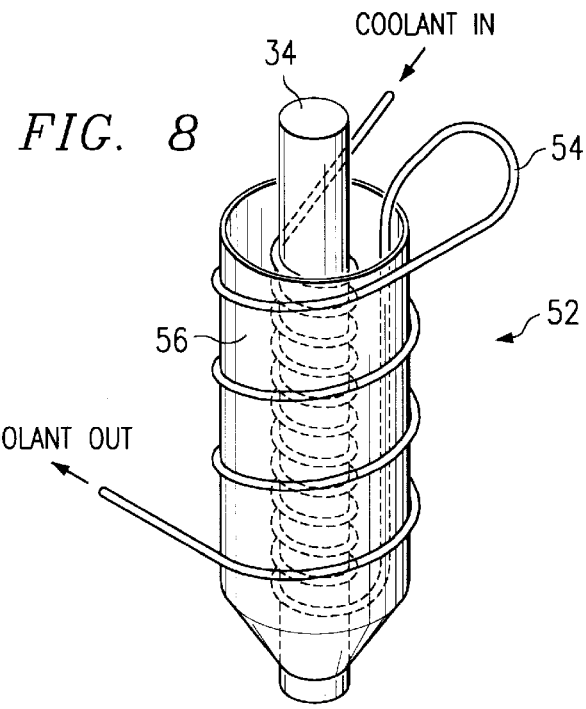
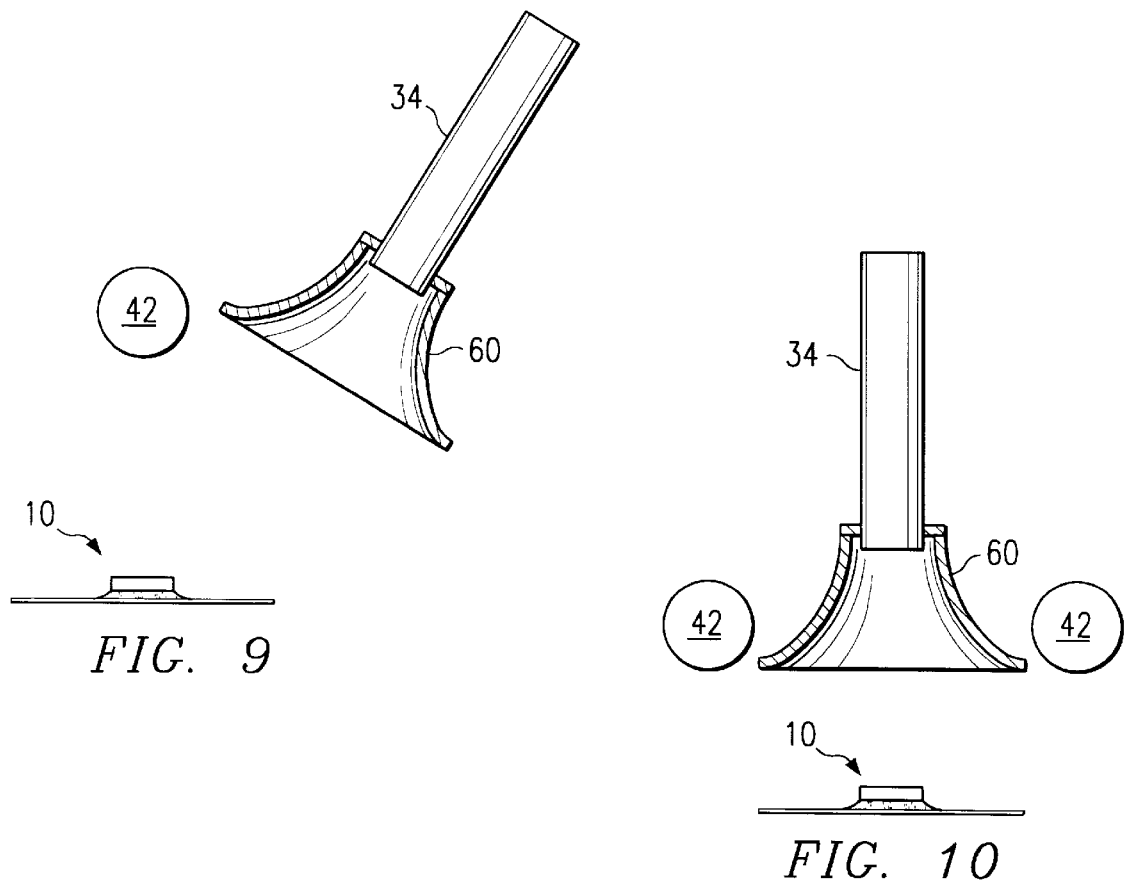

METHOD AND APPARATUS FOR MEASURING TEMPERATURES DURING ELECTRONIC PACKAGE ASSEMBLY

This application claims the benefit of U.S. Provisional Ser. No. 60/070,433 filed Jan. 5, 1998.

TECHNICAL FIELD OF THE INVENTION

The present invention relates in general to the field of electronic device packaging, and more particularly to an improved method and apparatus for measuring the die temperature during electronic packaging assembly.

BACKGROUND OF THE INVENTION

Silicon wafers, sometimes as large as eight inches in diameter, are used in the manufacture of integrated circuits (hereinafter "ICs"). A typical silicon wafer contains dozens, sometimes hundreds of individual ICs, depending on the size of the IC being fabricated. Following the fabrication process, the individual ICs are separated from the wafer by sawing, to form IC chips or dies. Each IC chip or die undergoes a packaging process in which the die is mounted and attached to a leadframe with an epoxy or other suitable adhesive. The leadframe usually includes a patterned strip of electrical conductors. Electrical connections are made between each IC and the associated leadframe. The entire structure is typically encapsulated within a polymeric material to protect the IC and electrical contacts from the environment. This packaging process produces products known as plastic electronic packages.

Since the epoxy or other suitable adhesive (hereinafter "die attach") is typically a thermal set material, the curing process requires that a minimum temperature be obtained before it will completely solidify. Overheating the die attach causes the die attach to become brittle resulting in cracks and degraded performance. Under cured die attach will often result in poor adhesion between the die and the associated leadframe causing the die to separate from the leadframe during subsequent process steps. Hence, it is very important that the temperature of the curing oven be monitored and controlled.

Many ICs are also placed into ceramic packages which provide better protection against the environment. This assembly process is similar to plastic electronic packaging, except different materials and processing temperatures are used. For example, the die attach for ceramic packages often includes a silver/glass adhesive. Silver and glass particles are held in suspension by various organic solvents. The silver/glass die attach has the consistency of a paste and is not cured in the same manner as epoxy compounds, but is thermally processed to "burn off" the organic solvents so the silver/glass mixture will form a solid, high quality bond.

The temperature control for the die attach curing process is typically accomplished by monitoring and adjusting the ambient temperature inside the oven. The oven temperature is typically measured by suspending one or more thermocouples inside the oven as near the parts being processed as possible. For certain processes, indirect temperature measurement of the oven is satisfactory if the program temperature changes are stretched over an extended period of time allowing the part to heat up or cool down at a relatively slow rate. For these processes, the temperature of the parts will be nearly the same as the oven temperature.

Recently, new die attach materials have been introduced in the electronic packaging industry which require novel approaches to monitoring and controlling the temperature of the part. The new die attach materials rapidly cure in a matter of one to five minutes as compared to a more standard cure cycle of thirty to sixty minutes.

One major advantage of these rapid cure processes is the dramatic reduction in cycle time and operating cost. Nevertheless, these rapid cure processes represent a new set of design rules for the accurate and repeatable control of the cure temperatures. For many of these new designs, it is no longer possible to correlate the ambient temperature of the oven to the temperature of the die being processed because the temperature of the die is changing much faster than the ambient oven temperature. The chances of dies either being under or overheated are more likely to occur.

SUMMARY OF THE INVENTION

Therefore, a new measurement system is necessary if a "real time" control system is to be maintained. Accordingly, a need has arisen in the art for an improved method for measuring die temperature during thermal processing of electronic packages. The present invention provides a method for measuring die temperature that substantially eliminates or reduces problems associated with the prior die temperature measurement methods.

In accordance with one embodiment of the present invention, a method of measuring die temperature during thermal processing of electronic packages includes an oven of the type used for rapid thermal process (RTP) curing of the die attach contained within an electronic package. The oven may utilize tungsten halogen lamps or radiant heaters as the heating element. An infrared temperature sensor or detector may also be provided to accurately monitor the temperature of the die and/or die attach during thermal processing. Although it is desirable, but impractical to measure the temperature of the die attach directly, the temperature of the die is used as an indirect measurement of the die attach temperature. However, in actuality the temperatures of the die and its associated die attach are nearly equal. As a secondary target, the temperature of the leadframe can also be used as an indirect measurement of the die attach temperature. The infrared detector may be attached to, or be an integral part of, the RTP oven. A real time control system capable of monitoring and analyzing the temperature of the die and adjusting the intensity of the tungsten halogen lamps accordingly, may also be provided.

More specifically, in accordance with teachings of the present invention, a cooling jacket may be provided to protect the infrared detector from increased ambient temperatures caused by heat generated by the curing oven or emitted from the electronic package during thermal processing. The cooling jacket may include a metallic sleeve surrounding copper tubing. Coolants such as chilled water, tap water or air may be provided at one end of the copper tubing. The coolants may then be allowed to flow through the copper tubing, cooling the jacket and the infrared detector.

In another embodiment of the present invention, a sight tube may be attached to one end of an infrared detector to effectively increase the emissivity of the surface being measured by reducing the thermal radiation from the surrounding environment. In this manner, the sight tube is intended to enhance the performance of the infrared detector.

Technical advantages of the present invention include providing a method of measuring the in-situ temperature of an electronics package with a high degree of accuracy. The present invention allows the actual temperature of the components of the electronic package to be measured without physically touching the components. In this manner, there is no danger of contaminating the components with particulate matter, damaging the surface of the components, or of changing the temperature of the components at the point of contact.

Further technical advantages of the present invention include providing a method of measuring the actual temperature of the components of an electronic package during thermal processing rather than approximating the temperature of the package through a series of ambient oven temperature readings. This method provides for rapid feedback of die temperature to the control electronics of the curing oven. Measuring the actual temperature of the components of the electronic package will ensure a better bond between the die and the leadframe, by ensuring that the die attach is exposed to the desired thermal profile.

Other technical advantages will be readily apparent to one skilled in the art from the following figures, descriptions and claims.

DESCRIPTION OF THE DRAWINGS

For a more complete understanding of the present invention and its advantages thereof, reference is now made to the following brief description, taken in conjunction with the accompanying drawings and detailed description, wherein like reference numerals represent like parts, in which:

FIG. 8 is a perspective drawing in elevation with portions broken away illustrating a cooling jacket of the type used in one embodiment of the present invention;

FIG. 9 is a schematic drawing in section and in elevation with portions broken away illustrating a sight tube of the type utilized in one embodiment of the present invention; and FIG. 10 is a schematic drawing in section and in elevation with portions broken away illustrating an alternative embodiment of a sight tube.

DETAILED DESCRIPTION OF THE INVENTION

Figure 1:
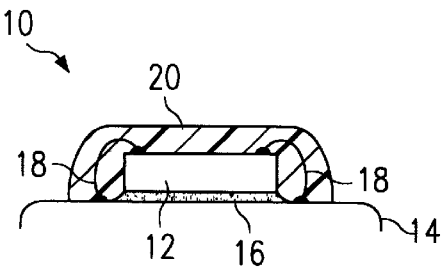
FIG. 1 is a schematic drawing in section with portions broken away illustrating a plastic electronic package.

The preferred embodiments of the present invention and its advantages are best understood by referring now in more detail to FIGS. 1–10 of the drawings, in which like numerals refer to like parts.

As shown in the drawings for purposes of illustration, the present invention is embodied in a method and apparatus for directly measuring the temperature of an electronic package while it is being thermally processed. The method and apparatus include incorporating infrared detector 34 into an RTP oven 40. The infrared detector 34 allows the direct measurement of the temperature of the die and/or die attach during thermal processing of the electronic package.

For purposes of illustrating one embodiment of the present invention, electronic package 10 is shown in FIG. 1 with polymeric material 20 encapsulating die 12 and leadframe 14. This packaging technique may sometimes be referred to as plastic electronic packaging. The present invention may also be satisfactorily used with any other electronic packaging techniques such as ceramic packaging and is not limited to use with only plastic electronic packaging. For purposes of the present invention, the term "die" is used to indicate any semiconductor material including silicon, gallium arsenide, or any other semiconductor material used in electronic device production.

Electronic package 10 includes die 12 attached to leadframe 14 with thermoset die attach 16. One embodiment of the present invention includes using dual-in-line leadframe design. Dual-in-line packages are constructed using an electronics assembly process called "through-hole" assembly. Other through-hole assembly package examples include single-in-line, zigzag, and pin grid array. In through-hole assembly, the fingers of leafrrame 14 are typically inserted either into a connector or alternatively into holes formed or drilled in a printed circuit board (PCB).

Another embodiment of the present invention involves using electronic package designs used in an electronics assembly process called surface mount assembly. Common surface mount package examples include quad flat package (QFP), small-outline package (SOP), J-leaded SOP (SOJ), and leaded chip carrier (LCC). In surface mount assembly, the fingers of the leadframe are not inserted into holes on the PCB or in a connector, but are typically mounted on the surface of the PCB. Solder applied to the fingers of the leadframe is used to connect the package both mechanically and electrically to the PCB.

One more electronic component manufacturing process that can take advantage of the present invention is known as area array electronic package. Some examples of area array electronic package designs are ball grid array electronic package and flip-chip electronic package. With a ball grid array electronic package, various input and output ports of an integrated circuit are typically connected via wire bonds to contact pads of the ball grid array electronic package. Solder balls formed on the contact pads of the ball grid array electronic package are used to complete the connection to another electronic component such as a PCB. However, solder balls in a flip chip design are attached directly to the input and output ports on the face of the integrated circuit. Flip-chip packages do not require wire bonds. For area array electronic assembly, the solder connections are thermally processed which would allow using this present invention to monitor the temperature of the solder connections to ensure optimized properties.

Throughout this application, the term leadframe is defined as that packaging constituent that is mechanically attached to the semiconductor die by either an epoxy material or matrix of solder balls and that facilitates electrically connecting the integrated circuit to another electronic component. Typically leadframes in the industry are made from conductive metals such as copper or Alloy-42 and quite often contain a thin coating of silver, gold or palladium. However, in this application, the term leadframes also refers to organic substrates or interposers commonly used in area array packages. Electronic substrates or interposers consist of an insulating material having electrically conductive paths extending through the interposer from one surface to the opposite surface forming electrical entry and exit paths.

Figure 2:
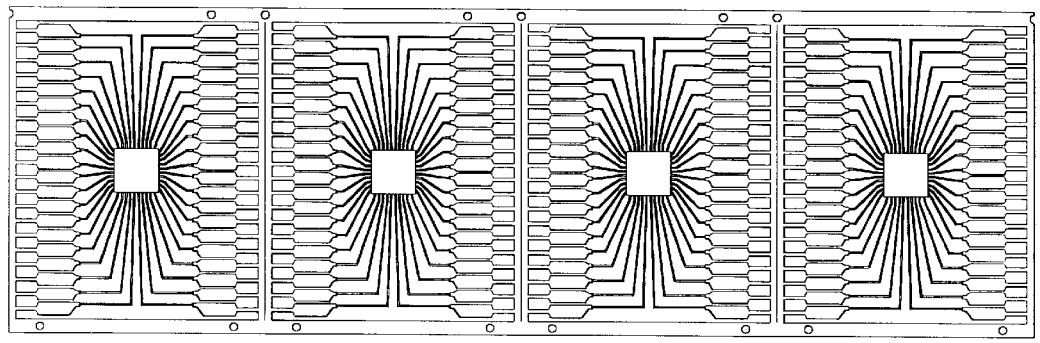
FIG. 2 is a schematic drawing showing a top plan view of four dual-in-line leadframes of the type used in the plastic electronic package of FIG. 1.

FIG. 2 illustrates a view of four dual-in-line leadframes which may be used to provide leadframe 14. Wire leads 18 electrically connect leadframe 14 to die 12. Polymeric or plastic material 20 protects wire leader 18, die 12, die attach 16, and portions of leadframe 14 from exposure to the environment. The assembly step of attaching die 12 to leadframe 14 is typically performed by automated equipment and includes dispensing a small amount of die attach 16 onto leadframe 14 and lowering die 12 onto die attach 16. Die attach 16 serves to fix die 12 and leadframe 14 in place and is also formulated to assist in minimizing stress and removing heat from a powered "ON" plastic electronic package 10. Die attach 16 is typically cured or transformed from a gel to a solid by applying heat in a conveyor like convection or infrared oven, until a desired temperature of several hundred degrees centigrade is achieved.

Although the preferred embodiment of the present invention includes RTP oven 40, the teachings of the present invention can be used in conjunction with any type of device used in thermal processing of electronic packages. For purposes of the present invention, the term "oven" indicates any enclosure in which heat or light energy is applied to an electronic package or any component of an electronic package to heat, dry, or cure the electronic package or any component of the electronic package.

Figure 3:
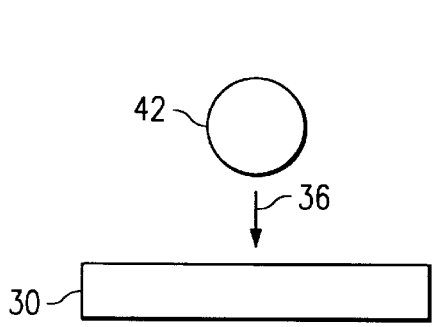
FIG. 3 is a schematic drawing in elevation showing a system of heating a target with energy emitted from a tungsten halogen lamp.
Figure 4:
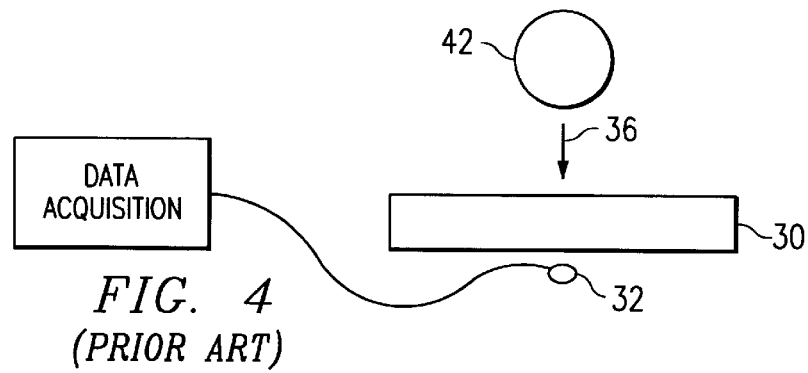
FIG. 4 is a schematic drawing in elevation illustrating a method of collecting temperature data during the process demonstrated in FIG. 3.
Figure 6:
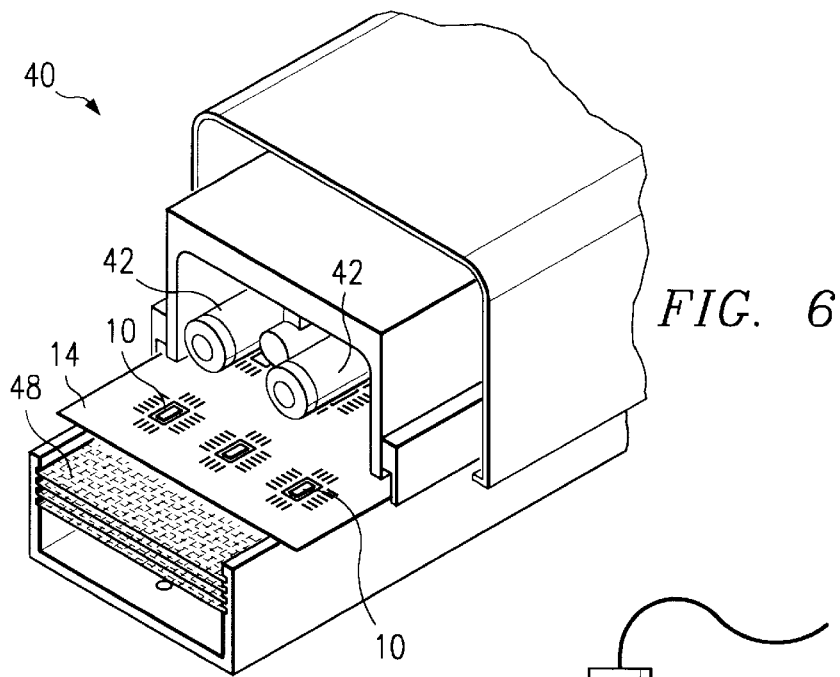
FIG. 6 is an isometric drawing in section with portions broken away illustrating a rapid thermal process oven.
Figure 7:
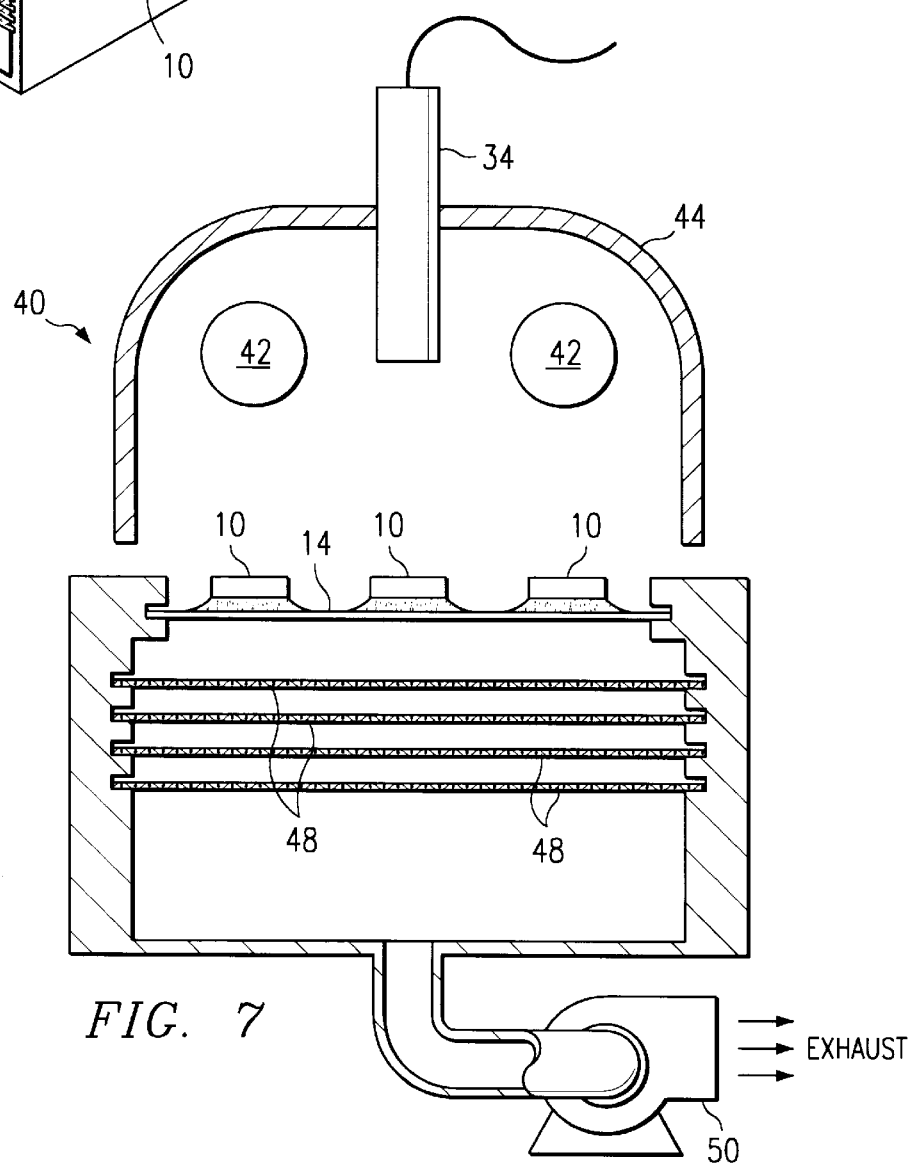
FIG. 7 is a schematic drawing in section with portions broken away illustrating a side view of a rapid thermal process oven similar to the type shown in FIG. 6.

As shown in FIGS. 6 and 7, tungsten halogen lamps 42 may be used as the source of thermal energy 36 to heat electronic package 10 or any other desired target 30. FIG. 3 illustrates a tungsten halogen lamp 42 transferring thermal energy 36 to target 30. In FIG. 4, a conventional temperature sensor 32 has been added to the system to collect data on the ambient temperature at a location close to, and underneath target 30. As target 30 absorbs thermal energy 36, the temperature of target 30 increases and heat is released to the surrounding environment. Temperature sensor 32 is located close enough to target 30 to get an approximate temperature of target 30. It is difficult to measure the exact temperature of target 30 with temperature sensor 32 because conventional temperature sensors may contaminate or damage the surface of target 30 upon direct contact or change the temperature of target 30.

Figure 5:
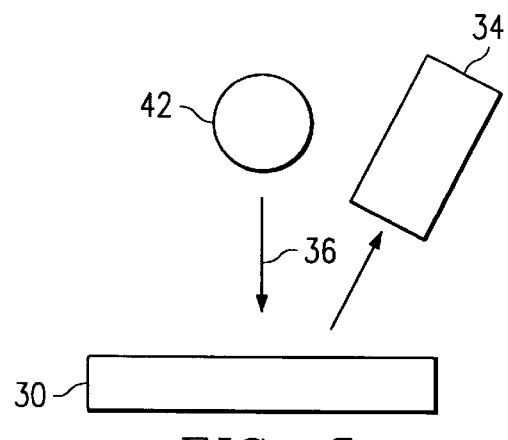
FIG. 5 is a schematic drawing in elevation illustrating the system of FIG. 3 incorporating an infrared detector for temperature measurement of the target in accordance with teachings of the present invention.

In order to get a more accurate temperature reading of target 30, FIG. 5 demonstrates the use of infrared detector 34 in accordance with teachings of the present invention. Infrared detector 34 is capable of obtaining a more accurate real time temperature reading of target 30 than the apparatus shown in FIG. 4. Infrared detector 34 does not need to directly contact target 30 to achieve an accurate temperature reading of die 12.

FIGS. 6 and 7 illustrate an automated RTP oven 40 which may be used in heating and thermal processing of plastic electronic packages such as electronic package 10. A cross-sectional view of an RTP oven 40 similar to the one shown in FIG. 6 is illustrated in FIG. 7.

RTP oven 40 includes tungsten halogen lamps 42 and reflector 44 which directs thermal energy 36 to electronic package 10. As thermal energy 36 is absorbed by electronic package 10, the temperature of electronic package 10 including die attach 16 rises. Infrared detector 34 receives heat energy radiated from electronic package 10 and converts the heat passively to an electrical signal which may be converted to a temperature measurement corresponding with the characteristics of infrared detector 34. An example of an infrared detector suitable for one embodiment of the present invention includes the IRt/c.2 as manufactured by Exergen Corporation. Typically detectors are available in various minimum spot sizes in order to match spot size to die size. It is recommended by manufacturers that detectors be used with a target larger than minimum spot size.

Each component of electronic package 10 becomes hotter as thermal energy 36 emitted from tungsten halogen lamps 42 is increased. By focusing infrared detector 34 at one of the dies 12, a continuous, in-line feedback system is set up where the thermal energy emitted by electronic package 10 is related to the temperature of the die 12 and not to the ambient temperature of RTP oven 40. As die 12 approaches the temperature at which die attach 16 cures or becomes solid, the feedback system reduces the power to tungsten halogen lamps 42, slowing down the thermal heat-up and ultimately the temperature that die attach 16 reaches.

An alternative embodiment of the present invention includes a system in which an infrared sensor is directed toward the leadframe on the side opposite of the die. Thus, the infrared temperature sensor can measure the temperature of the back side of the leadframe or any other component of the electronic package.

Since tungsten halogen lamps 42 are used to heat die 12 and die attach 16, there is no obstruction below die 12 and leadframe 14. An exhaust system 50 can be used to draw any fumes from die attach 16 directly down through leadframe 14 and multiple screen diffuser 48. As a result, contaminations from die attach 16 outgasing on the die 12 and leadframe 14 is minimized. Normally die 12 will absorb much more thermal energy 36 than leadframe 14. As a result, leadframe 14 is at a lower temperature than die 12 during cure. This minimizes oxidation on leadframe 14 as well as stress on die 12.

It is imperative that the electronic components associated with infrared detector 34 be kept from overheating since the accuracy and repeatability of its reading are generally dependent upon the temperature of its surroundings. Infrared detectors 34 can be protected from the heat emitted by the oven components and die attach 16 during thermal processing by maintaining an adequate distance between die attach 16 and infrared detector 34. This becomes more difficult as the size of die attach 16 or die 12 is decreased and infrared detector 34 must be positioned closer to die attach 16 to receive an accurate temperature reading.

Infrared detector 34 can also be prevented from overheating by externally cooling it by installing cooling jacket 52 over infrared detector 34 as shown in FIG. 8. Cooling jacket 52 includes copper tubing 54 and sleeve 56. To enhance its cooling effectiveness, the copper tubing 54 that is coiled around the outside of sleeve 56 can also be soldered to the sleeve to improve its thermal conductivity. Copper tubing 54 is coiled around detector 34 inside sleeve 56 and after exiting sleeve 56 is coiled around the outside of sleeve 56. Copper tubing 54 is also wrapped with insulation (not shown) which is contained within sleeve 56. Copper tubing 54 forms an "open" coolant loop which is connected to a coolant source, allowing a continuous flow of coolant through copper tubing 54. Cooling jacket 52 is designed to be installed over infrared detector 34. Cooling jacket 52 is intended to maintain infrared detector 34 at room temperature even when the oven-ambient temperature reaches several hundred degrees centigrade.

Hence, if infrared detector 34 is protected from the environment of the oven either by water cooling or by distancing the detector from the oven, infrared detector 34 can perform the role of measuring directly the temperature of die 12 and/or die attach 16.

Referring now to FIGS. 9 and 10, sight tube 60 is provided. Sight tube 60 is preferably affixed to infrared detector 34. Sight tube 60 may be required for accurate temperature measurement of any highly reflective, low emissivity surface including typical metallic leadframes 14. Sight tube 60 serves to increase the emissivity of the surface being measured by reducing the reflections from the surrounding environment. In the preferred embodiment, sight tube 60 is tubular and painted black on the inside and contains appendages or flaps near the target to reduce reflections from the surroundings. Also, many vendors now supply low emissivity infrared detectors 34 that are better suited for the measurement of very reflective surfaces.

The teachings of the present invention will also allow greater flexibility in the processing of various different types of electronic packages. The operating parameters of RTP oven 40 could be adjusted quite easily since the thermal profile would be based on actual die temperatures. Frequently different electronic package designs can be handled in the same oven, but changes to the oven parameters must be verified by conducting a sometimes lengthy series of mechanical test on the processed parts. Knowing the actual real time temperature of die 12 and/or die attach 16 may allow operators to bypass some of these acceptance tests.

From a statistical process control view point, measuring the temperature of each die 12 and/or die attach 16 should reduce the standard deviations and improve the overall quality by imparting more uniform mechanical properties to the finished electronic packages. Small variances in the parts that make up an electronic package can yield slight, but sometimes critical differences in the overall mass of the packages due to the packages initial lightweight mass. The heat up and cool down rates of the parts and ultimately the temperature of the parts are impacted to a large extent by the mass of the part. For example, heavier parts require more time to heat up given the same time and power conditions. Infrared detector 34 substantially reduces or eliminates concerns with variations between parts because the actual temperature of die 12 and its associated die attach 16 is being measured directly, allowing die 12 and die attach 16 to be heated until the optimal temperature is reached, not until a certain hypothetical time has expired.

The performance of nearly all electronic packaging assembly processes can be enhanced by incorporating this invention, including ceramic packaging and any process requiring attachment of die to a leadframe or substrate/interposer (i.e. flip chip package and chip size package). The teachings of the present invention can be incorporated into most standard oven designs in use by the electronics industry today. Parts no longer have to be processed based on the amount of time required inside an oven, but rather the parts can be removed and the process terminated when the particular part has reached its optimum temperature.

Certain electronic packages may require more time to cure due to a thicker die attach 16. Others may require shorter time because the thickness of the die attach 16 is less. In order to adjust those parameters, the furnace parameters must be adjusted. By taking a direct temperature reading with infrared detector 34, oven 40 parameters can be changed more rapidly than with the traditional mechanical thermocouples on dies.

The preferred embodiment of the present invention involves the in-situ temperature measurement of leadframes, ceramic headers, and dies sitting on leadframes and ceramic headers. The teachings of the present invention can be modified to work equally well to measure the temperature of other electronics packages including ball grid array (BGA) and chip scale packages (CSP). The materials used in these package types include organic laminates, ceramics, metals and polymeric sheets and films. The teachings of the present invention can be applied to any of these package types to measure the temperature of the package or any component within the package.

Although the present invention and its advantages have been described in detail, it should be understood that various changes, substitutions, and alterations can be made therein without departing from the spirit and scope of the invention as defined by the appended claims.

What is claimed is:

1. A method for the assembly of a packaged semiconductor circuit device comprising the steps of:

placing a circuit die in contact with a thermosetting die-attach adhesive on a leadframe;

heating said die, adhesive, and leadframe in a rapid thermal processing oven;

focussing an infrared sensor on said die to selectively measure the temperature of the die; and controlling the oven temperature, responsive to the temperature of the die, such that the die temperature is never allowed to exceed a predetermined limit, thereby avoiding thermal damage to the die, consistent with a maximum cure rate for the die-attached adhesive, and a consequent maximum throughput; including the step of reducing power to the heating means before the die temperature reaches said predetermined limit.

* * * * *